United States Patent
Teysseyre

(10) Patent No.: US 7,005,322 B2
(45) Date of Patent: Feb. 28, 2006

(54) PROCESS FOR ENCAPSULATING SEMICONDUCTOR COMPONENTS USING THROUGH-HOLES IN THE SEMICONDUCTOR COMPONENTS SUPPORT SUBSTRATES

(75) Inventor: Jérôme Teysseyre, Grenoble (FR)

(73) Assignee: STMicroelectronics, S.A., Montrogue (FR)

( * ) Notice: Subject to any disclaimer, the term of this patent is extended or adjusted under 35 U.S.C. 154(b) by 0 days.

(21) Appl. No.: 10/867,382

(22) Filed: Jun. 14, 2004

(65) Prior Publication Data

US 2005/0026417 A1 Feb. 3, 2005

(30) Foreign Application Priority Data

Jun. 17, 2003 (FR) .................................. 03 07250

(51) Int. Cl.
*H01L 21/48* (2006.01)
*H01L 21/50* (2006.01)

(52) U.S. Cl. ....................... 438/108; 438/113
(58) Field of Classification Search ................ 438/106, 438/108, 113, 114
See application file for complete search history.

(56) References Cited

U.S. PATENT DOCUMENTS

| | | | |
|---|---|---|---|
| 5,120,678 A | * | 6/1992 | Moore et al. .................. 29/840 |
| 5,663,106 A | * | 9/1997 | Karavakis et al. ............. 29/841 |
| 5,683,942 A | | 11/1997 | Kata et al. |
| 5,697,148 A | * | 12/1997 | Lance et al. ................... 29/840 |
| 5,766,982 A | * | 6/1998 | Akram et al. .................. 438/51 |
| 6,074,897 A | * | 6/2000 | Degani et al. ............... 438/115 |
| 6,329,224 B1 | * | 12/2001 | Nguyen et al. ............. 438/127 |
| 6,544,814 B1 | | 4/2003 | Yasunaga et al. |
| 6,617,177 B1 | * | 9/2003 | Winer .......................... 438/14 |
| 6,617,682 B1 | * | 9/2003 | Ma et al. ..................... 257/706 |
| 6,743,069 B1 | * | 6/2004 | Palanisamy ................... 445/25 |
| 2002/0125561 A1 | | 9/2002 | Hashimoto |
| 2002/0173069 A1 | | 11/2002 | Shibata |
| 2005/0023658 A1 | * | 2/2005 | Tabira et al. ................ 257/678 |
| 2005/0029651 A1 | * | 2/2005 | Tomioka et al. ............. 257/712 |

* cited by examiner

*Primary Examiner*—Scott Geyer
(74) *Attorney, Agent, or Firm*—Lisa K. Jorgenson; Jon A. Gibbons; Fleit, Kain, Gibbons, Gutman, Bongini & Bianco, P.L.

(57) ABSTRACT

Process for fabricating semiconductor components, and semiconductor component, in which a support plate comprises, at various locations, portions provided with respective electrical connection means having electrical connection regions on a front face and having through-holes located in proximity or adjacently to the portions. An integrated-circuit chip is fastened to the front face of each portion of the support plate by means of electrical connection balls. On one side, the electrical connection balls are connected to electrical connection regions of the front face of this plate and, on the other side, to electrical connection pads on the rear face of this integrated-circuit chip, in positions such that one edge of the rear face of each integrated-circuit chip faces at least one through-hole. A curable liquid fill material is delivered in the through-holes so as to at least partly fills a space defined between this support plate and each integrated-circuit chip, respectively.

12 Claims, 2 Drawing Sheets

PROCESS FOR ENCAPSULATING SEMICONDUCTOR COMPONENTS USING THROUGH-HOLES IN THE SEMICONDUCTOR COMPONENTS SUPPORT SUBSTRATES

CROSS-REFERENCE TO RELATED APPLICATIONS

This application is based upon and claims priority from prior French Patent Application No. 03 07250, filed on Jun. 17, 2003 the entire disclosure of which is herein incorporated by reference.

FIELD OF THE INVENTION

The present invention generally relates to the field of semiconductor components and packages. More specifically, the present invention relates to semiconductor packages containing integrated-circuit chips.

BACKGROUND OF THE INVENTION

One known method of fabricating semiconductor components consists in fastening integrated-circuit chips to the front face of a support plate with electrical connection balls at predetermined locations. On one side, the electrical connection balls are fastened to electrical connection regions of the front face of the support plate. On the other side, the electrical connection balls are fastened to pads on a rear face of the integrated circuit chip. A fill material fills a region defined between the integrated-circuit chip and the support plate. The support plate is sawed so as to form discrete packages with typically one semiconductor component per location on the support plate.

Although the fabrication of semiconductor packages using the above process is useful, it is not without its shortcomings. One shortcoming is the complexity in fabricating the semiconductor component.

Accordingly, a need exists to overcome the shortcomings and drawbacks of the prior art when reducing the size of capacitors in integrated electronic circuits and to provide a simplified process for fabricating semiconductor components.

SUMMARY OF THE INVENTION

Briefly, in accordance with the present invention, disclosed is a process for fabricating semiconductor components. The process includes producing a support plate divided into portions. Each portion of the support plate includes electrical connection means having electrical connection regions on a front face and electrical connection regions on a rear face. The support plate includes through-holes. An integrated-circuit chip is fastened to the front face to a portion of the support plate by electrical connection balls. On one side, the electrical connection balls are connected to electrical connection regions of the front face of the support plate. On the other side, the electrical connection balls are connected to electrical connection pads on the rear face of the integrated-circuit chip, in positions such that one edge of the rear face of each integrated-circuit chip faces at least one through-hole.

A curable liquid fill material is delivered, through the through-holes, between the plate and each chip in such a way that, after curing, this fill material at least partly fills the space between the support plate and each integrated-circuit chip. After the fill material has cured, each of the portions of the support plate are separated forming semiconductor components.

According to the invention, the process may consist in producing a support plate having a through-hole between two portions, the hole being placed in such a way that one edge of the rear face of the integrated-circuit chips are fastened to portions of the front face of the support plate facing the through-hole.

According to the invention, the process may consist in producing a support plate having portions separated by elongated holes and branches that connect the corners of these portions together, the branches being arranged with respect to one another in such a way that the edges of the rear face of the chips that are fastened to these portions face these holes.

According to the invention, the portions are preferably connected by linking branches of a small cross section so as to be able to be snapped or broken.

The present invention also describes a semiconductor component, which comprises a support plate provided with electrical connection means having electrical connection regions on a front face and an integrated-circuit chip connected to the front face of the plate by means of electrical connection balls that are fastened, on one side, to electrical connection regions of the rear face of this plate and, on the other side, to electrical connection pads on the rear face of this chip, the plate extending beyond the edges of the chip, and a fill material at least partly filling the space between the plate and the chip and encapsulating the electrical connection balls.

According to the invention, the connection means preferably comprises electrical connection regions provided on the rear face of the support plate.

BRIEF DESCRIPTION OF THE DRAWINGS

The present invention will be more clearly understood on examining a semiconductor component and one method of fabricating the latter, these being described and particularly pointed out and distinctly claimed in the claims at the conclusion of the specification. The foregoing and other features, and advantages of the present invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In these figures, for the sake of clarity, the dimensions of the various parts of the components shown are not drawn to scale. These figures are cross-sectional views of a substantially planar substrate, considered in a plane perpendicular to the surface of the substrate. The substrate is placed in the lower part of each figure and D denotes a direction perpendicular to the surface of the substrate, directed towards the top of the figures. In what follows, the terms "front", "rear", and "portion" are used with reference to this orientation. Moreover, in all the figures, identical references correspond to identical elements.

Figure 1:
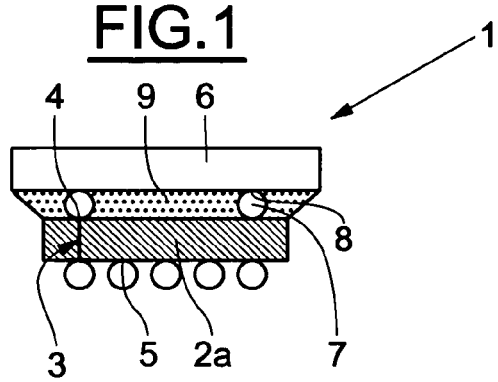
FIG. 1 shows a cross section of a semiconductor component according to the present invention.

Shown in FIG. 1 is a semiconductor component 1 which comprises an approximately square portion of an electrical connection support plate 2a that carries electrical connection means 3 having electrical connection regions 4 on its front face and electrical connection regions 5 on its rear face, these being connected together selectively.

The semiconductor component 1 furthermore comprises an approximately square integrated-circuit chip 6, larger than the support plate 2a, which is fixed flat to, and at a certain distance from, the support plate 2a by means of electrical connection balls 7 soldered, on one side, to regions 4 of the support plate 2a and, on the other side, to electrical connection pads 8 provided on the rear face of the chip 6.

The support plate 2a and the chip 6 are dimensioned and arranged one with respect to the other in such a way that the peripheral edges of the rear surface of the chip 6 extend beyond and along the peripheral edges of the support plate 2a.

The semiconductor component 1, furthermore, includes a cured fill material 9 that completely fills the space between the support plate 2a and the first chip 10, embedding the electrical connection balls 7 and also at least partly the through-passage 11. As may be seen, this fill material 9 also covers at least some of the regions 4 to which the electrical connection wires 3 are connected.

The various steps in the fabrication of the semiconductor component 1 will now be described with reference to FIGS. 2 to 5.

The fabrication of a multiplicity of semiconductor components 1 starts with a support plate 2 that has a multiplicity of support plate portions 2a arranged in the form of a rectangular matrix, defining a multiplicity of locations 10.

Each portion 2a is provided with electrical connection means 3. The portions 2a are placed at a certain distance apart in such a way that two adjacent portions 2a are both separated by an elongated through-hole 11 or slot, the corresponding edges of the adjacent portions being parallel.

The plate 2 also has a plurality of linking branches 12 which connect the respective adjacent corners of the portions 2a.

Figure 2:
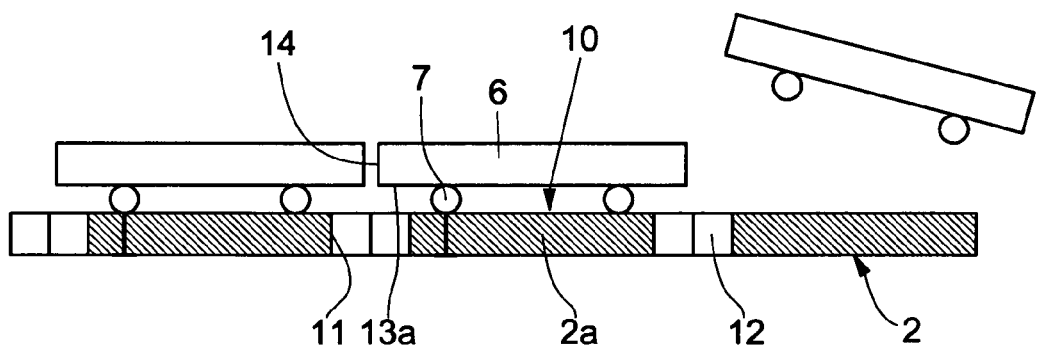
FIG. 2 shows a cross section of the component in a first fabrication step.
Figure 3:
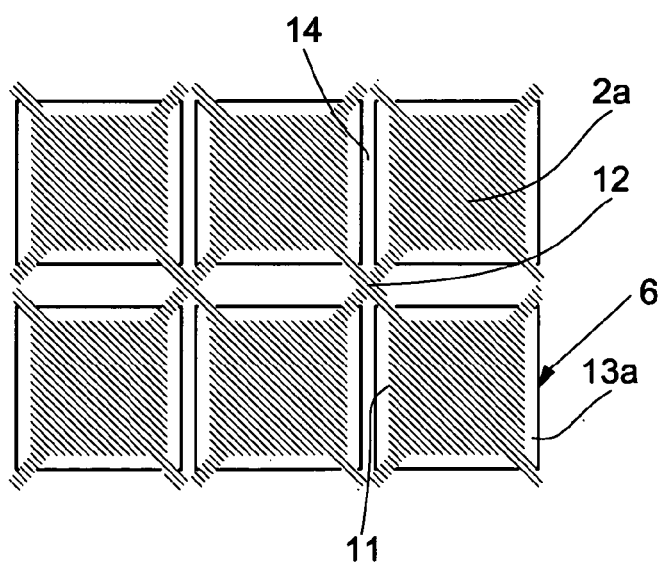
FIG. 3 shows a plan view of the component, on the plate side, at this first fabrication step.

Starting with the plate 2 and through-holes defined, a first fabrication step consists, as shown in FIG. 2, in mounting, at each location 10, an integrated-circuit chip 6 to each respective support plate portion 2a, as described above, by means of electrical connection and fastening balls 7.

More precisely, each chip 6 is installed on each support plate portion 2a in such a way that peripheral; edges 13a of the rear surface of each chip extend beyond the periphery of the support plate portion 2a that bears it, facing the through-holes 11 formed laterally to this support plate portion 2a, the chips 6 being spaced apart from one another, leaving between them a space 14 of uniform width that is smaller than the width of the elongated holes 11, the elongated holes 11 and the spaces 14 being respectively located approximately in the same plane of symmetry.

Figure 4:
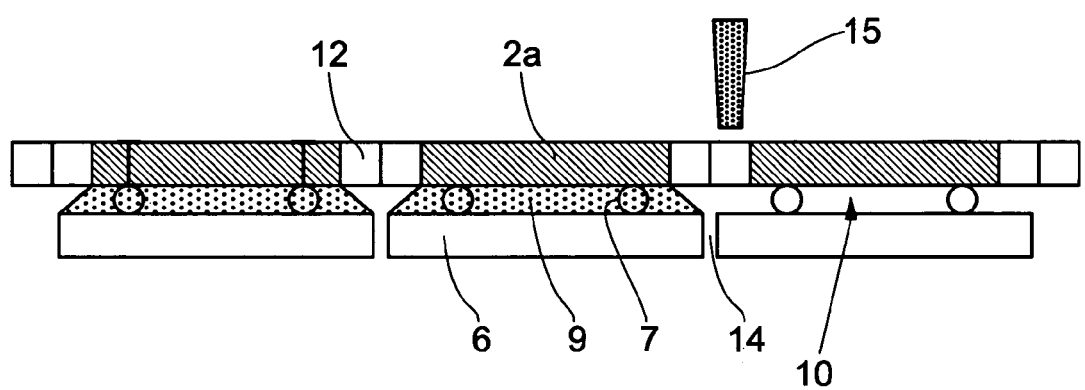
FIG. 4 shows a cross section of the component at the next fabrication step.

FIG. 4 shows the next fabrication step, which consists in placing the assembly obtained above so as to be horizontal in a position such that the support plate 2 faces up and the chips 6 face down.

Then, this step consists, using a suitable needle 15, in placing, in succession, from above, this needle as close as possible to each support plate portion 2a, above each edge 13a of each chip 6 in order to deliver a predetermined quantity of a curable liquid fill material 9 which, by a capillary effect, propagates into and fills the space separating each support plate portion 2a from each chip 6, without running over into the spaces 14 that separate the chips 6 and without running into the spaces that separate the chips from the neighboring supporting plate portions.

Once the fill material 9 has cured, the next operation consists in snapping or breaking the various linking branches 12a of the plate 2 so as to obtain as many semiconductor components 1 as the plate 2 had support plate portions 2a corresponding to the locations 10, the linking branches being of small cross section in order to facilitate this separation.

Figure 5:
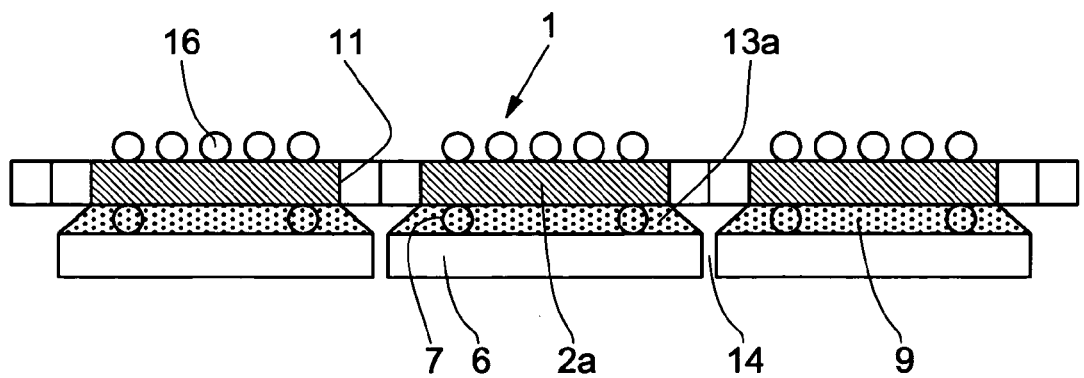
FIG. 5 shows a cross section of the component at the next fabrication step.

In an alternative embodiment shown in FIG. 5, before the above separation is performed, the next operation may consist in depositing electrical connection balls or drops 16 on, and soldering them to, the electrical connection regions 5 of the rear face of the support plate portions 2a. Having done this, the linking branches 12a can then be broken so as to obtain individual semiconductor components 1.

The present invention is not limited to the examples described above. Many alternative embodiments are possible without departing from the scope defined by the appended claims.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. A process for producing semiconductor components, the process comprising:
   forming a support plate with one or more portions wherein at least some of these portions of the support plate include a front face with electrical connection means having electrical connection regions, and the support plate having through-holes located adjacent to the portions of the support plate;
   fastening at least a first integrated-circuit chip to the front face of each portion of the support plate by means of electrical connection balls, wherein the electrical connection balls are connected, on one side, to electrical connection regions of the front face of the support plate and, on the other side, to electrical connection pads on a rear face of the first integrated-circuit chip, in positions such that one edge of the rear face of the first integrated-circuit chip faces at least one through-hole;
   delivering, through the through-hole, a curable liquid fill material between the support plate and the first integrated-circuit chip in such a way that, after curing, this fill material at least partly fills a space defined between the support plate and the first integrated-circuit chip, wherein the forming of the support plate includes forming a common through-hole between two portions of the support plate including a first portion and a second portion, the first portion having the first integrated-circuit chip fastened thereto and the second portion having at least a second integrated-circuit chip fastened thereto, the common through-hole being placed in such a way that one edge of the rear face of each of the first integrated-circuit chip and at least a second integrated-circuit chip fastened to the first and second portions of the support plate respectively, faces the common through-hole; and separating the portions so as to form semiconductor components after the fill material has cured, wherein the portions are separated along a line intersecting a space between the first integrated-circuit chip and the second integrated-circuit chip, the line transversing the common through-hole.

2. The process according to claim 1, wherein the forming of the support plate includes forming the support plate with portions separated by elongated through-holes and linking branches that connect the corners of these portions of the support plate together, wherein the linking branches are arranged with respect to one another in such a way that edges of the rear face of the first integrated-circuit chip that are fastened to these portions of the support plate face these elongated through-holes.

3. The process according to claim 2, wherein the portions of the support plate are connected by linking branches of a small cross section so as to be able to be at least one of snapped and broken.

4. The process according to claim 1, wherein the portions of the support plates are connected by linking branches of a small cross section so as to be able to be at least one of snapped and broken.

5. The process according to claim 1, wherein the portions of the support plate are connected by linking branches of a small cross section so as to be able to be at least one of snapped and broken.

6. The process according to claim 1, wherein the one edge of the rear face and an additional edge situated at an end of the rear face opposite of the one edge of at least the first integrated-circuit chip extend beyond a periphery of the support plate portion to which the first integrate-circuit chip is fastened thereto.

7. A process for producing semiconductor components, the process comprising:

forming a support plate with one or more portions wherein at least some of these portions of the support plate include a front face with electrical connection means having electrical connection regions, and the support plate having through-holes located adjacent to the portions of the support plate;

fastening at least one integrated-circuit chip to the front face of each portion of the support plate by means of electrical connection balls, wherein the electrical connection balls are connected, on one side, to electrical connection regions of the front face of the support plate and, on the other side, to electrical connection pads on a rear face of the integrated-circuit chip, in positions such that one edge of the rear face of the integrated-circuit chip faces at least one through-hole;

delivering, through the through-hole, a curable liquid fill material between the support plate and the integrated-circuit chip in such a way that, after curing, this fill material at least partly fills a space defined between the support plate and each integrated-circuit chip; and separating the portions so as to form semiconductor components after the fill material has cured, wherein the forming of the support plate includes forming the support plate with portions separated by elongated through-holes and linking branches that connect a set of corners of these portions of the support plate together, wherein the linking branches are arranged with respect to one another in such a way that edges of the rear face of the integrated-circuit chip that are fastened to these portions of the support plate face these elongated through-holes.

8. The process according to claim 7, wherein the forming of the support plate includes forming the support plate with portions separated by elongated through-holes and linking branches that connect the corners of these portions of the support plate together, wherein the linking branches are arranged with respect to one another in such a way that edges of the rear face of the integrated-circuit chip that are fastened to these portions of the support plate face these elongated through-holes.

9. The process according to claim 8, wherein the portions of the support plate are connected by linking branches of a small cross section so as to be able to be at least one of snapped and broken.

10. The process according to claim 7, wherein the portions of the support plated are connected by linking branches of a small cross section so as to be able to be at least one of snapped and broken.

11. The process according to claim 7, wherein the portions of the support plate are connected by linking branches of a small cross section so as to be able to be at least one of snapped and broken.

12. The process according to claim 7, wherein the portions of the support plate are connected by linking branches of a small cross section so as to be able to be at least one of snapped and broken.

* * * * *

UNITED STATES PATENT AND TRADEMARK OFFICE
CERTIFICATE OF CORRECTION

PATENT NO. : 7,005,322 B2 Page 1 of 1
DATED : February 28, 2006
INVENTOR(S) : Jerome Teysseyre It is certified that error appears in the above-identified patent and that said Letters Patent is hereby corrected as shown below:

Column 6,
Line 40, change "plated" to -- plate --.

Signed and Sealed this

Twenty-third Day of May, 2006

JON W. DUDAS
*Director of the United States Patent and Trademark Office*